US 11,367,388 B2

(12) United States Patent
Tan et al.

(10) Patent No.: US 11,367,388 B2
(45) Date of Patent: Jun. 21, 2022

(54) PIXEL STRUCTURE AND CONTROL METHOD THEREOF, DRIVER CIRCUIT, ARRAY SUBSTRATE AND DISPLAY APPARATUS

(71) Applicant: BOE TECHNOLOGY GROUP CO., LTD., Beijing (CN)

(72) Inventors: Wenjing Tan, Beijing (CN); Kuo Sun, Beijing (CN); Yu Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/271,680

(22) PCT Filed: May 18, 2020

(86) PCT No.: PCT/CN2020/090872
§ 371 (c)(1),
(2) Date: Feb. 26, 2021

(87) PCT Pub. No.: WO2020/233548
PCT Pub. Date: Nov. 26, 2020

(65) Prior Publication Data

US 2021/0193033 A1 Jun. 24, 2021

(30) Foreign Application Priority Data

May 21, 2019 (CN) .......................... 201910425563.8

(51) Int. Cl.
*G09G 3/3225* (2016.01)
*G09G 3/20* (2006.01)

(52) U.S. Cl.
CPC ......... *G09G 3/3225* (2013.01); *G09G 3/2003* (2013.01); *G09G 2300/0452* (2013.01);
(Continued)

(58) Field of Classification Search
CPC ... G09G 2300/0426; G09G 2300/0452; G09G 2310/0286; G09G 2320/0242; G09G 3/2003; G09G 3/3225; H01L 27/32
See application file for complete search history.

(56) References Cited

U.S. PATENT DOCUMENTS

2016/0240593 A1* 8/2016 Gu ..................... H01L 27/3262
2019/0130155 A1   5/2019 Park
(Continued)

FOREIGN PATENT DOCUMENTS

CN   108257514   7/2018
CN   108364967   8/2018
(Continued)

OTHER PUBLICATIONS

International Search Report (w/ English Translation) for corresponding PCT Application No. PCT/CN2020/090872, dated Aug. 18, 2020, 6 pages.
(Continued)

*Primary Examiner* — Kenneth Bukowski
(74) *Attorney, Agent, or Firm* — Dority & Manning, P.A.

(57) ABSTRACT

The pixel structure includes a plurality of first pixel units disposed in a first region and at least one second pixel unit disposed in a second region. A distribution density of the plurality of first pixel units is greater than that of the at least one second pixel unit. Each first pixel unit includes a plurality of first sub-pixels, and each second pixel unit includes a plurality of second sub-pixels. A number of first sub-pixels included in the first pixel unit is equal to that of second sub-pixels included in the second pixel unit. A number of at least one first sub-pixel of the first pixel unit that displays a color is equal to that of at least one second sub-pixel of the second pixel unit that displays a same color,
(Continued)

and light-emitting areas of a first sub-pixel and a second sub-pixel that display a same color are equal.

14 Claims, 7 Drawing Sheets

(52) U.S. Cl.
CPC .............. *G09G 2310/0286* (2013.01); *G09G 2320/0242* (2013.01)

(56) References Cited

U.S. PATENT DOCUMENTS

| | | | |
|---|---|---|---|
| 2019/0140030 A1* | 5/2019 | Huangfu | H01L 27/3279 |
| 2019/0326366 A1* | 10/2019 | Fan | H01L 27/3218 |
| 2020/0098837 A1* | 3/2020 | Bian | G09G 3/3233 |
| 2020/0227488 A1* | 7/2020 | Xin | H01L 27/3225 |
| 2020/0234634 A1 | 7/2020 | Li | |
| 2021/0193033 A1 | 6/2021 | Tan et al. | |
| 2021/0225817 A1* | 7/2021 | Liao | H01L 25/167 |

FOREIGN PATENT DOCUMENTS

| | | |
|---|---|---|
| CN | 207817361 | 9/2018 |
| CN | 109274792 | 1/2019 |
| CN | 208507679 | 2/2019 |
| CN | 109728048 | 5/2019 |
| CN | 112750402 A * | 5/2021 |
| JP | 2003228040 | 8/2003 |

OTHER PUBLICATIONS

First Chinese Office Action (w/ English Translation) for corresponding Chinese Application No. 201910425563.8, 14 pages.

* cited by examiner

PIXEL STRUCTURE AND CONTROL METHOD THEREOF, DRIVER CIRCUIT, ARRAY SUBSTRATE AND DISPLAY APPARATUS

CROSS-REFERENCE TO RELATED APPLICATIONS

This application is a national phase entry under 35 USC 371 of International Patent Application No. PCT/CN2020/090872 filed May 18, 2020, which claims priority to Chinese Patent Application No. 201910425563.8, filed May 21, 2019, which are incorporated herein by reference in their entirety.

TECHNICAL FIELD

The present disclosure relates to the field of display technologies, and in particular, to a pixel structure and a control method thereof, a driver circuit, an array substrate and a display apparatus.

BACKGROUND

With the advent of the "bezel-free screen" era, a high screen-to-body ratio becomes a new development trend for electronic devices such as mobile phones and notebook computers. The screen-to-body ratio refers to a ratio of a screen area of a display screen to an entire front surface area of the display screen. The display screen is designed as a special-shaped display screen with a notch area in which sensors of the display screen such as a camera and a light sensor can be disposed, so as to improve the screen-to-body ratio of the screen. However, the special-shaped display screen is not a true "bezel-free screen" as the notch area thereof cannot be used for display, and the screen-to-body ratio is still relatively low.

In the related art, the sensors are disposed under the display screen, for example, with an under-screen fingerprint unlocking technology, a display area over the sensors can also be used for display, which may improve the screen-to-body ratio.

SUMMARY

In one aspect, a pixel structure is provided. The pixel structure has a first region and a second region. The pixel structure includes a plurality of first pixel units disposed in the first region and at least one second pixel unit disposed in the second region. A distribution density of the plurality of first pixel units in the first region is greater than a distribution density of the at least one second pixel unit disposed in the second region. Each first pixel unit includes a plurality of first sub-pixels, and each second pixel unit includes a plurality of second sub-pixels; a number of the first sub-pixels included in the first pixel unit is equal to a number of the second sub-pixels included in the second pixel unit. A number of at least one first sub-pixel of the first pixel unit that displays a color is equal to a number of at least one second sub-pixel of the second pixel unit that displays a same color, and light-emitting areas of a first sub-pixel and a second sub-pixel that display a same color are equal.

In some embodiments, the plurality of first sub-pixels included in the first pixel unit include one first color sub-pixel, one second color sub-pixel and two third color sub-pixels. The plurality of second sub-pixels included in the second pixel unit include one first color sub-pixel, one second color sub-pixel and two third color sub-pixels. The first color, the second color and the third color are three primary colors.

In some embodiments, in the first region, the first color sub-pixel, the second color sub-pixel and the two third color sub-pixels are arranged periodically in a row direction of an arrangement of sub-pixels, and the two third color sub-pixels are arranged in a column direction of the arrangement of the sub-pixels. First sub-pixels in every two adjacent rows are staggered from each other in the column direction.

In some embodiments, in the second pixel unit, the first color sub-pixel and the second color sub-pixel are arranged adjacently in the row direction, and the two third color sub-pixels are arranged in the column direction and are respectively located on two sides of the first color sub-pixel and the second color sub-pixel in the column direction.

In some embodiments, in the second pixel unit, the first color sub-pixel and the second color sub-pixel are arranged adjacently in the row direction, and the two third color sub-pixels are arranged in the column direction and are both located on one of two sides of the first color sub-pixel and the second color sub-pixel in the column direction.

In some embodiments, in the second pixel unit, the first color sub-pixel, the two third color sub-pixels and the second color sub-pixel are arranged sequentially in the row direction, and the two third color sub-pixels are arranged in the column direction.

In some embodiments, the at least one second pixel unit includes a plurality of second pixel units, in a row direction in which sub-pixels are arranged, a row of red sub-pixels in the second region are aligned with a row of red sub-pixels in the first region; a row of blue sub-pixels in the second region are aligned with a row of blue sub-pixels in the first region; and a row of green sub-pixels in the second region are aligned with a row of green sub-pixels in the first region.

In some embodiments, the first color is red and the second color is blue, or the first color is blue and the second color is red; and the third color is green.

In some embodiments, a light-emitting area of the first color sub-pixel is equal to a light-emitting area of the second color sub-pixel, and a light-emitting area of the third color sub-pixel is half of the light-emitting area of the first color sub-pixel.

In another aspect, an array substrate is provided. The array substrate includes a base, the pixel structure as described in the above embodiments and a driver circuit for driving the pixel structure. The pixel structure and the driver circuit are disposed on the base. The driver circuit includes a plurality of cascaded shift register circuits that include a plurality of first shift register circuits and at least one second shift register circuit. Each first pixel unit in the pixel structure is coupled with at least one first shift register circuit, and each second pixel unit in the pixel structure is coupled with the at least one second shift register circuit.

In some embodiments, the plurality of second sub-pixels included in the second pixel unit are coupled with a same second shift register circuit.

In some embodiments, the plurality of second sub-pixels include one first color sub-pixel, one second color sub-pixel and two third color sub-pixels; the two third color sub-pixels are connected in parallel, and the two third color sub-pixels connected in parallel, the first color sub-pixel and the second color sub-pixel are connected in series to the second shift register circuit.

In some embodiments, the plurality of second sub-pixels include in the second pixel unit are coupled with at least two second shift register circuits.

In some embodiments, the plurality of second sub-pixels include one first color sub-pixel, one second color sub-pixel and two third color sub-pixels; one of the two third color sub-pixels, the first color sub-pixel and the second color sub-pixel are connected in series to one second shift register circuit, and another one of the two third color sub-pixels is coupled with another second shift register circuit.

In some embodiments, the plurality of shift register circuits further include a plurality of third shift register circuits; and the plurality of third shift register circuits are not coupled with the first pixel unit or the second pixel unit; the plurality of third shift register circuits are located on at least one side of the second region of the pixel structure. An arrangement density of the plurality of first shift register circuits is equal to an overall arrangement density of the at least one second shift register circuit and the plurality of third shift register circuits.

In yet another aspect, a display apparatus is provided. The display apparatus includes the array substrate as described in the above embodiments.

In yet another aspect, a control method of the pixel structure as described in the above embodiments is provided. Each first pixel unit and each second pixel unit in the pixel structure both include one first color sub-pixel, one second color sub-pixel and two third color sub-pixels. The control method includes: determining a coordinate point in an original image data matrix corresponding to each second pixel unit of the pixel structure according to the original image data matrix of an image to be displayed; obtaining coordinate points on a left side of, on a right side of and below the determined coordinate point, or coordinate points on the left side of, on the right side of and above the determined coordinate point;

assigning values to the three obtained coordinate points, so as to make a gray scale value of a first color sub-pixel corresponding to the coordinate point on the left side equal to a gray scale value of a first color sub-pixel corresponding to the determined coordinate point, a gray scale value of a second color sub-pixel corresponding to the coordinate point on the right side equal to a gray scale value of a second color sub-pixel corresponding to the determined coordinate point, and a gray scale value of a third color sub-pixel corresponding to the coordinate point below or above equal to a gray scale value of a third color sub-pixel corresponding to the determined coordinate point; updating the original image data matrix according to an assignment result; and obtaining screen data gray scale values of sub-pixels in the first region and the second region of the pixel structure through a same rendering function according to the updated original image data matrix, so as to control the sub-pixels in the first region and the second region to display the image to be displayed.

BRIEF DESCRIPTION OF THE DRAWINGS

In order to describe technical solutions of the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to those drawings. In addition, the accompanying drawings to be described below may be regarded as schematic diagrams; and are not limitations on actual sizes of products, an actual process of a method and actual timings of signals that the embodiments of the present disclosure relate to.

DETAILED DESCRIPTION

Figure 1:
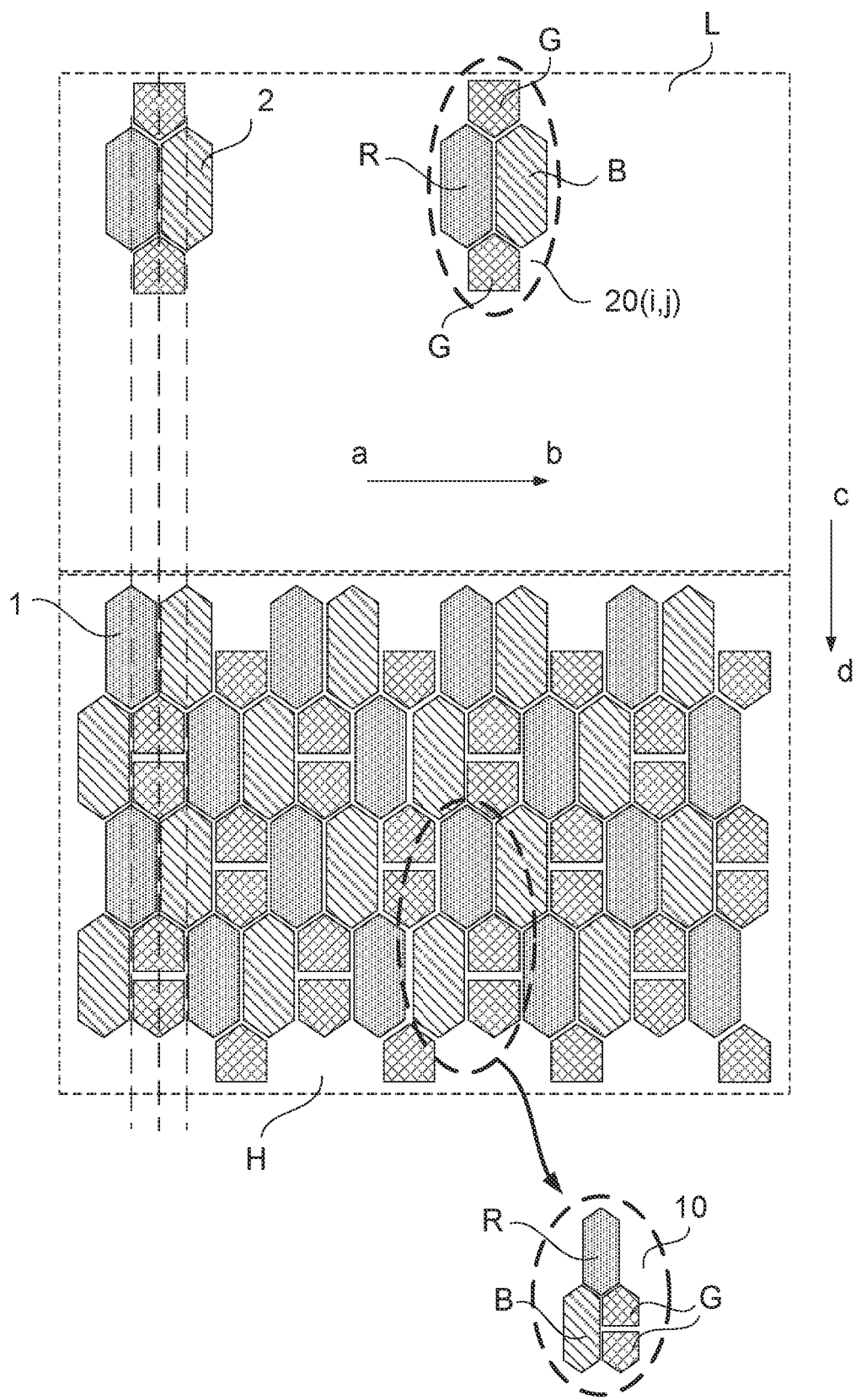
FIG. 1 is a structural diagram of a pixel structure, in accordance with some embodiments.

Technical solutions in embodiments of the present disclosure will be described below clearly and completely with reference to the accompanying drawings. Obviously, the described embodiments are merely some but not all of embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "including, but not limited to." In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are used for descriptive purposes only, and are not to be construed as indicating or implying the relative importance or implicitly indicating the number of indicated technical features below. Thus, features defined with "first" and "second" may explicitly or implicitly include one or more of the features. In the description of the embodiments of the present disclosure, the term "a plurality of the plurality of" means two or more unless otherwise specified.

In the description of some embodiments, the terms such as "coupled" and "connected" and their extensions may be used. For example, some embodiments may be described using the term "connected" to indicate that two or more elements are in direct physical or electrical contact with each other. For another example, the term "coupled" may be used in the description of some embodiments to indicate that two or more components are in direct physical or electrical contact. However, the term "coupled" or "communicatively coupled" may also mean that two or more elements are not in direct contact with each other, but still cooperate or interact with each other. The embodiments disclosed herein are not necessarily limited to the contents herein.

In the related art, the screen-to-body ratio is increased by arranging sensors under the display screen. In order to realize a sensing function of the sensors disposed under the display screen, a region of the display screen that corresponds to the sensors (hereinafter referred to as a low-resolution region) is made to have a lower resolution than the remaining areas that are mainly used for display (hereinafter referred to as a high-resolution region), which may enable signals to be sent or received by the sensors through the low-resolution area.

Since there is a difference between the low-resolution region that corresponds to the sensors and the high-resolution region in the display screen, there is a difference existing in the display image during normal display process, which may affect the display effect. In addition, since the low-resolution area is also used for display, as for a sensor with high signal transmittance requirement, such as a camera or a light sensor, it is not feasible to realize an under-screen sensing function through the existing display screens.

An embodiment of the present disclosure provides a pixel structure 200. As shown in FIG. 1, the pixel structure 200 has a first region H and a second region L.

For example, the second region L may be arranged on at least one side of the first region H, or, the first region H may be arranged around the second region L.

The pixel structure 200 includes a plurality of first pixel units 10 disposed in the first region H and at least one second pixel unit 20 disposed in the second region L.

A distribution density of the plurality of first pixel units 10 in the first region H is greater than a distribution density of the at least one second pixel unit 20 in the second region L.

The first pixel unit 10 includes a plurality of first sub-pixels 1, and the second pixel unit 20 includes a plurality of second sub-pixels 2.

In some embodiments, a sub-pixel is provided with a light-emitting device, and a pixel circuit coupled with the light-emitting device and used for driving the light-emitting device to emit light.

The pixel circuit is generally composed of electronic devices such as a thin film transistor (abbreviated as TFT) and capacitor (abbreviated as C). For example, the pixel circuit may be a pixel driver circuit of a 2T1C structure composed of two thin film transistors (i.e., one switching transistor and one driving transistor) and one capacitor. Of course, the pixel circuit may also be a pixel circuit composed of more than two thin film transistors (i.e., a plurality of switching transistors and one driving transistor) and at least one capacitor.

The light-emitting device includes a cathode, an anode, and a light-emitting functional layer between the cathode and the anode. The light-emitting functional layer may include, for example, an organic light-emitting layer, a hole transport layer between the organic light-emitting layer and the anode, and an electron transport layer between the organic light-emitting layer and the cathode. Of course, in some embodiments, a hole injection layer may also be disposed between the hole transport layer and the anode, and an electron injection layer may be disposed between the electron transport layer and the cathode, as desired.

A number of first sub-pixels 1 included in the first pixel unit 10 is equal to a number of second sub-pixels 2 included in the second pixel unit 20.

A number of first sub-pixel(s) 1 of the first pixel unit 10 that display a color is equal to a number of second sub-pixel(s) 2 of the second pixel unit 20 that display the same color, and light-emitting areas of a first sub-pixel 1 and a second sub-pixel 2 that display a same color are equal.

Since the distribution density of the second pixel units 20 in the second region L is relatively small, a signal transmittance of the second region L is relatively high. In this way, a sensing capability of the sensors to signals may be improved in a case where the sensors and other elements are disposed in the second region L, which may realize the under-screen sensing function of the display apparatus.

Since the light-emitting areas of the first sub-pixel 1 in the first region H and the second sub-pixel 2 in the second region L that display the same color are equal, when driven by a same electrical signal, the first sub-pixel 1 of the first region H and the second sub-pixel 2 of the second region L that display the same color have gray scale values equal to each other.

Moreover, the number of the first sub-pixels 1 included in the first pixel unit 10 is equal to the number of the second sub-pixels 2 included in the second pixel unit 20, and the numbers of the first sub-pixels 1 and the second sub-pixels 2 that display the same color are equal. Therefore, a number ratio of first sub-pixels 1 that display different colors in the first region H is equal to a number ratio proportion of second sub-pixels 2 that display different colors in the second region L. Therefore, in a case where the sub-pixels in the first region H and the sub-pixels in the second region L are driven by same electrical signals, a white balance of the first region H is the same as a white balance of the second region L. In this way, the under-screen sensing function is realized, and the white balance of the first region H and the white balance of the second region L may be consistent when the first pixel units 10 in the first region H and the second pixel units 20 in the second region L in the pixel structure 200 are driven by the same electrical signals (for example, when driven by a same driving device), which may avoid problems such as local color cast of the display apparatus 300 during a display process.

In summary, the pixel structure 200 includes the plurality of first pixel units 10 disposed in the first region H and the at least one second pixel unit 20 disposed in the second region L. The number of the first sub-pixels 1 included in the first pixel unit 10 is equal to the number of the second sub-pixels 2 included in the second pixel unit 20. The number of the first sub-pixel(s) 1 that display a color in the first pixel unit 10 is equal to the number of the second sub-pixel(s) 2 that display the same color in the second pixel unit 20, and the light-emitting areas of the first sub-pixel 1 and the second sub-pixel 2 that display the same color are equal. Therefore, driven by the same electrical signal, the first sub-pixel 1 of the first region H that displays the color and the second sub-pixel 2 of the second region L that displays the same color have the gray scale values equal to each other. Accordingly, the white balances of the first region H and the second region L are consistent, which may avoid the problems such as the local color cast during the display process.

In some embodiments, as shown in FIG. 1, the plurality of first sub-pixels 1 included in the first pixel unit 10 include one first color sub-pixel R, one second color sub-pixel B and two third color sub-pixels G.

The plurality of second sub-pixels 2 included in the second pixel unit 20 include one first color sub-pixel R, one second color sub-pixel B and two third color sub-pixels G.

The first color, the second color and the third color are three primary colors.

For example, the first color is red, and the second color is blue; or, the first color is blue, and the second color is red. The third color is green.

In some embodiments, as shown in FIG. 1, in the first region H, in a row direction ab of an arrangement of sub-pixels, the first color sub-pixel R, the second color sub-pixel B and the two third color sub-pixels G are periodically arranged, and the two third color sub-pixels G are arranged in a column direction cd of the sub-pixel arrangement.

In the column direction cd, first sub-pixels 1 in every two adjacent rows are staggered from each other.

It will be noted that, since the first region H and the second region L have spatial limitations at edges, arrangements of the first sub-pixel 1 in the first region H and the second sub-pixel 2 in the second region L mainly refer to arrangements of sub-pixels of the two regions other than the edge portions thereof. The arrangements of the sub-pixels in the edge portions of the first region H and the second region L may be different from arrangements of sub-pixels in other portions, which is not limited herein.

In some embodiments, as shown in FIG. 1, in the second pixel unit 20, the first color sub-pixel R and the second color sub-pixel B are arranged adjacently in the row direction ab, and the two third color sub-pixels G are arranged in the column direction cd and are respectively located on two sides of the first color sub-pixel R and the second color sub-pixel B in the column direction cd.

In this case, since the two third color sub-pixels G are both close to the first color sub-pixel R and the second color sub-pixel B, a color mixing effect of sub-pixels of different colors in the second pixel unit 20 may be enhanced, which avoids the color cast in the second region L during the display process, and improves the display effect.

Figure 2:
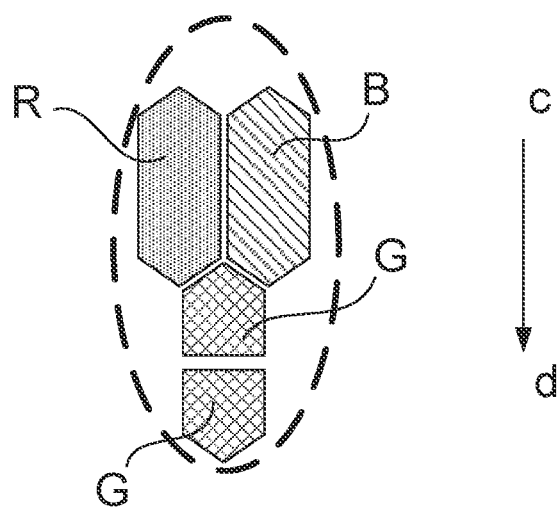
FIG. 2 is a structural diagram of a second pixel unit, in accordance with some embodiments.

In some embodiments, as shown in FIG. 2, in the second pixel unit 20, the first color sub-pixel R and the second color-pixel B are adjacently arranged in the row direction ab, and the two third color sub-pixels G are arranged in the column direction cd and are both located on a same side of the first color sub-pixel R and the second color sub-pixel B in the column direction cd.

In this case, since the two third color sub-pixels G are both close to the first color sub-pixel R and the second color sub-pixel B, the color mixing effect of the sub-pixels of different colors in the second pixel unit 20 may be enhanced, which avoids the color cast in the second region L during the display process, and improves the display effect.

Figure 3:
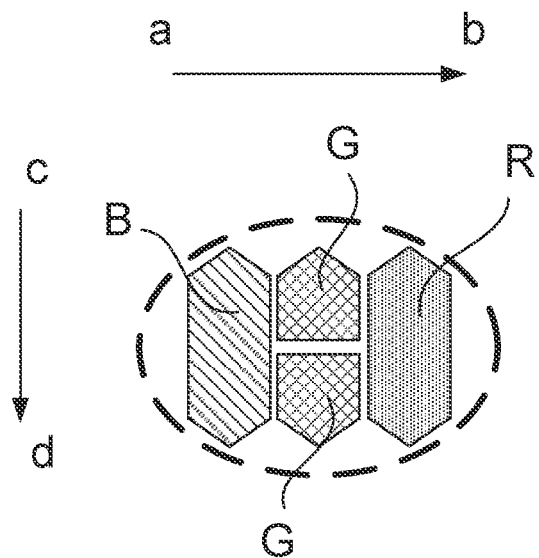
FIG. 3 is a structural diagram of another second pixel unit, in accordance with some embodiments.

In some embodiments, as shown in FIG. 3, in the second pixel unit 20, the first color sub-pixel R, the two third color sub-pixels G and the second color sub-pixel B are sequentially arranged in the row direction ab, and the two third color sub-pixels G are arranged in the column direction cd.

In this case, since the two third color sub-pixels G are both close to the first color sub-pixel R and the second color sub-pixel B, the color mixing effect of the sub-pixels of different colors in the second pixel unit 20 may be enhanced, which avoids the color cast in the second region L during the display process, and improves the display effect.

In some embodiments, as shown in FIG. 1, in the column direction cd, a column of first color sub-pixels in the first region H are aligned with a column of first color sub-pixels in the second region L, a column of second color sub-pixels in the first region H are aligned with a column of second color sub-pixels in the second region L, and a column of third color sub-pixels in the first region H are aligned with a column of third color sub-pixels in the second region L.

In some embodiments, in a case where the first color is red, the second color is blue, and the third color is green, as shown in FIG. 1, in the first pixel unit 10 and the second pixel unit 20, the first color sub-pixel R has a same light-emitting area as the second color sub-pixel B, and a light-emitting area of the third color sub-pixel G is half of the light-emitting area of the first color sub-pixel R.

For example, as shown in FIG. 1, the first color sub-pixel R has a same shape as the second color sub-pixel B.

For example, the first color sub-pixel R and the second color sub-pixel B may both have a shape of a hexagon, a rectangle, or an ellipse, and the third color sub-pixel G is half of the first color sub-pixel R, which means if the first color sub-pixel R is divided into two portions along a symmetry axis parallel to the row direction ab, the third color sub-pixel G has a same shape as one of the two divided portions of the first color sub-pixel R.

Figure 4:
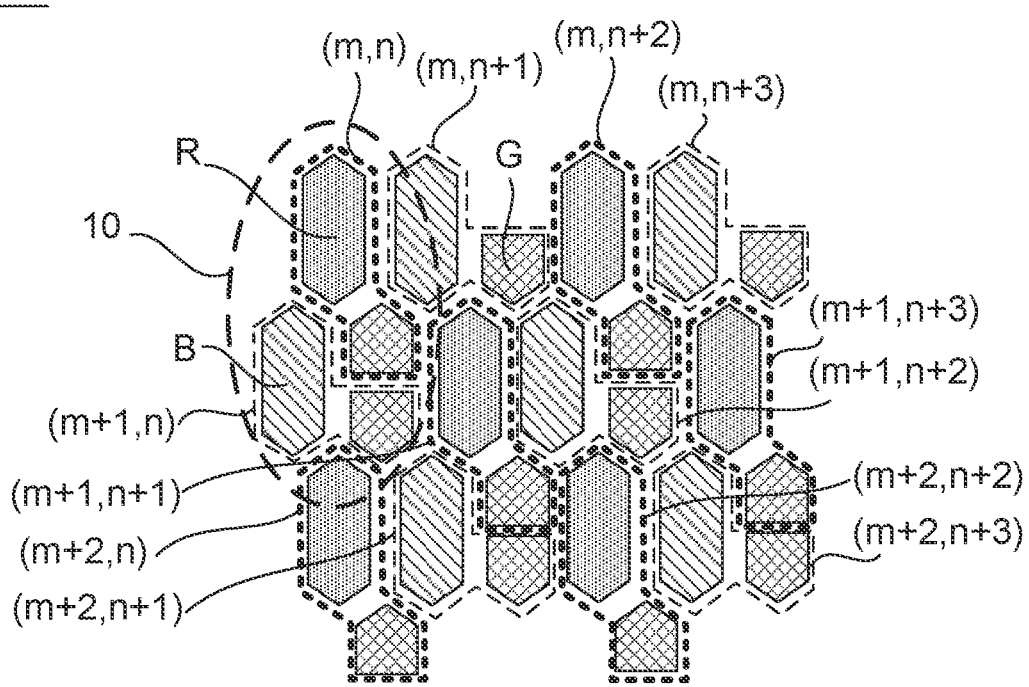
FIG. 4 is a structural diagram of a first region, in accordance with some embodiments.

In some embodiments, the plurality of first sub-pixels 1 in the first region H may be divided into a plurality of first screen pixels. As shown in FIG. 4, the plurality of first screen pixels in the first region H are classified into two types, i.e., a first screen pixel composed of one second color sub-pixel B and one third color sub-pixel G, and a first screen pixel composed of one first color sub-pixel R and one third color sub-pixel G.

In this case, referring to FIGS. 1 and 4, a first pixel unit 10 in the first region H includes two first screen pixels, i.e., a first screen pixel composed of one second color sub-pixel B and one third color sub-pixel G, and a first screen pixel composed of one first color sub-pixel R and one third color sub-pixel G.

For example, the two first screen pixels included in the first pixel unit 10 in the first region H are a first screen pixel (m, n) and a first screen pixel (m+1, n). Herein, m represents a number of a pixel row, n represents a number of a pixel column, and m and n are both positive integers.

In addition, as shown in FIG. 1, a second pixel unit 20 in the second region L is a second screen pixel. In this case, the second screen pixel in the second region L is composed of one first color sub-pixel R, one second color sub-pixel B and two third color sub-pixels G.

For example, a second pixel unit 20 is arranged every other (t−1) pixel row(s) in the second region L, and every other (t−1) pixel column(s) in the second region L. That is, a row of second pixel units 20 are arranged every other (t−1) pixel row(s) in the second region L, and two adjacent second pixel units 20 in a row of second pixel units 20 are spaced apart by (t−1) pixel column(s). First screen pixels in the first region H are arranged row by row and column by column (as shown in FIG. 4).

In this case, according to the formula of the distribution density of the pixels, $PPI=\sqrt{M^2+N^2}$, it can be known that a distribution density of the first screen pixels in the first region H is t times a distribution density of the second screen pixels in the second region L. Herein, PPI (Pixels Per Inch) represents the number of pixels per inch, M represents a number of screen pixels in a pixel row direction, N represents a number of screen pixels in a pixel column direction, and t is a positive integer.

For example, a second pixel unit 20 is arranged every other three pixel rows in the second region L, and a second pixel unit 20 is arranged every other three pixel columns in the second region L. That is, a second screen pixel is arranged every other three pixel rows and every other three pixel columns in the second region L, and the first screen pixels are arranged row by row and column by column in the first region H. In this case, the distribution density of the first screen pixels in the first region H is four times the distribution density of the second screen pixels in the second region L.

In this case, a resolution of an image to be displayed is 1080×2160, that is, the image to be displayed has 2160 rows and 1080 columns of image pixels, and an image pixel is a constituting unit of an image that is able to be actually observed by human eyes. In a case where image pixels in a first row to a 90-th row and a first column to a 1080-th column are displayed by the second screen pixels in the second region L, and image pixels in a 91-th row to a 2160-th row and a first column to a 1080-th column are displayed by the first screen pixels in the first region H, values may be assigned to coordinate points from an original image matrix data (i.e., matrix elements in the original image matrix data) corresponding to the image pixels in the first row to the 90-th row and the first column to the 1080-th column every four rows and every four columns. The assigned coordinate points are coordinate points that correspond to the second screen pixels. Values may be assigned to coordinate points from the original image data matrix corresponding to the image pixels in the 91-th row to the 2160-th row and the first column to the 1080-th column every row and every column.

Figure 5:
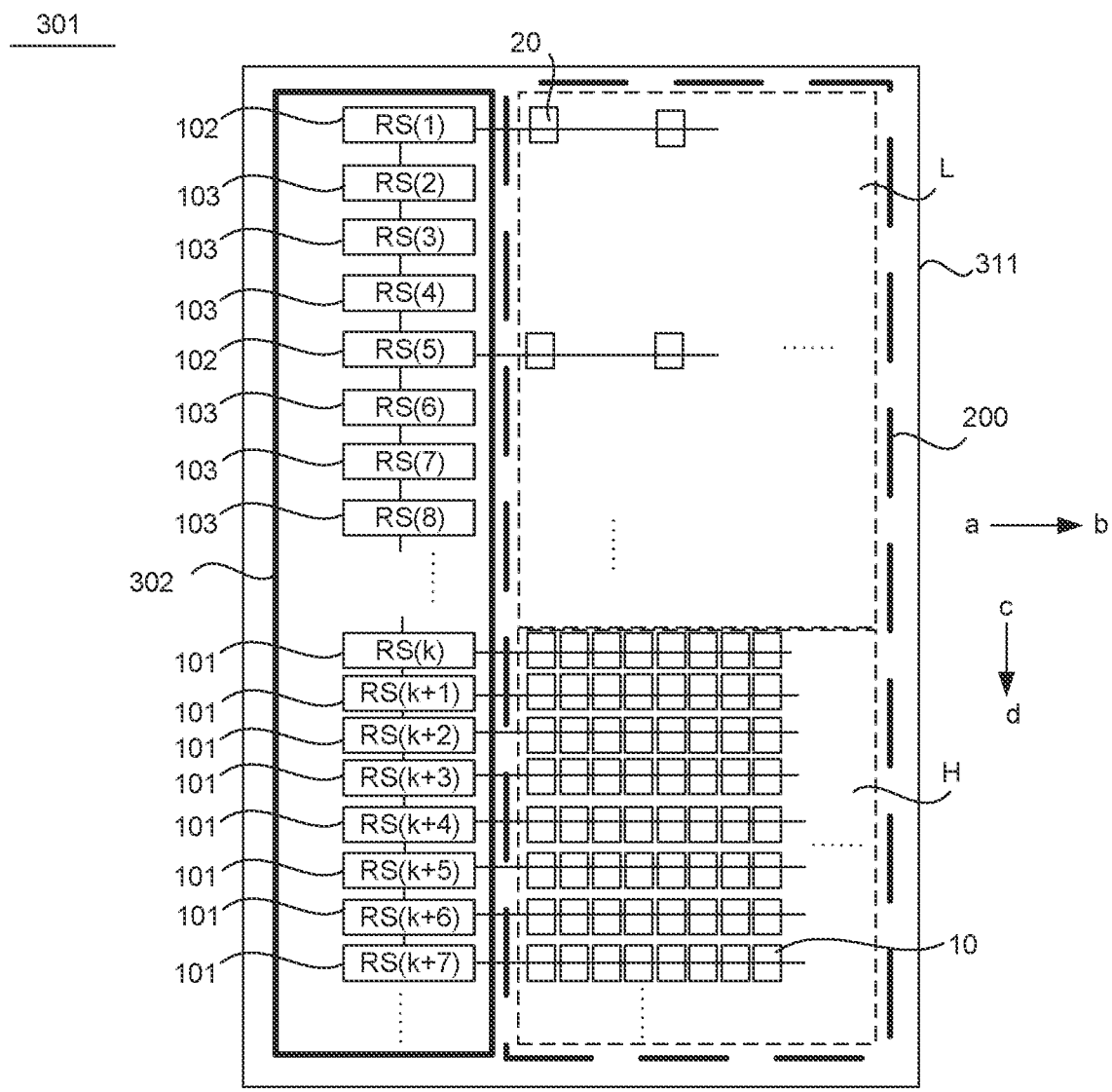
FIG. 5 is a structural diagram of an array substrate, in accordance with some embodiments.

An embodiment of the present disclosure provides an array substrate 301. As shown in FIG. 5, the array substrate 301 includes a base 311 and a pixel structure 200 disposed on the base 311 as described in any of the above embodiments.

As shown in FIG. 5, the array substrate 301 includes a driver circuit 302 which is disposed on the base 311.

An embodiment of the present disclosure provides a driver circuit 302 that is used for driving the pixel structure 200 as described in any of the above embodiments.

As shown in FIG. 5, the driver circuit 302 includes a plurality of cascaded shift register circuits RS. The plurality of shift register circuits RS include a plurality of first shift register circuits 101 and at least one second shift register circuit 102.

A first pixel unit 10 in the pixel structure 200 is coupled with at least one first shift register circuit 101. A second pixel unit 20 in the pixel structure 200 is coupled with at least one second shift register circuit 102.

For example, as shown in FIG. 5, a first stage shift register circuit RS(1) is coupled with a second pixel unit 20, a fifth stage shift register circuit RS(5) is coupled with a second pixel unit 20, and the first stage shift register circuit RS(1) and the fifth stage shift register circuit RS(5) are both second shift register circuits 102. A k-th stage shift register circuit RS(k) to a (k+7)-th stage shift register circuit RS(k+7) that are all first shift register circuits 101 are coupled with first pixel units 10.

In this case, the first sub-pixels 1 of the first pixel unit 10 in the first region H of the pixel structure 200 may be driven through the first shift register circuits 101 in the driver circuit 302, so as to enable the first region H to display images. In addition, the second sub-pixels 2 of the second pixel unit 20 in the second region L of the pixel structure 200 may be driven through the second shift register circuits 102 in the driver circuit 302, so as to enable the second region L of the pixel structure 200 to realize the display function.

It will be understood that, the first shift register circuit 101 transmits a driving signal to a pixel circuit in the first sub-pixel 1 of the first pixel unit 10 through a gate line, so as to drive the light-emitting device in the first sub-pixel 1 to emit light to display images. The second shift register circuit 102 transmits a driving signal to a pixel circuit in the second sub-pixel 2 of the second pixel unit 20 through a gate line, so as to drive the light-emitting device in the second sub-pixel 2 to emit light to display images.

Figure 6:
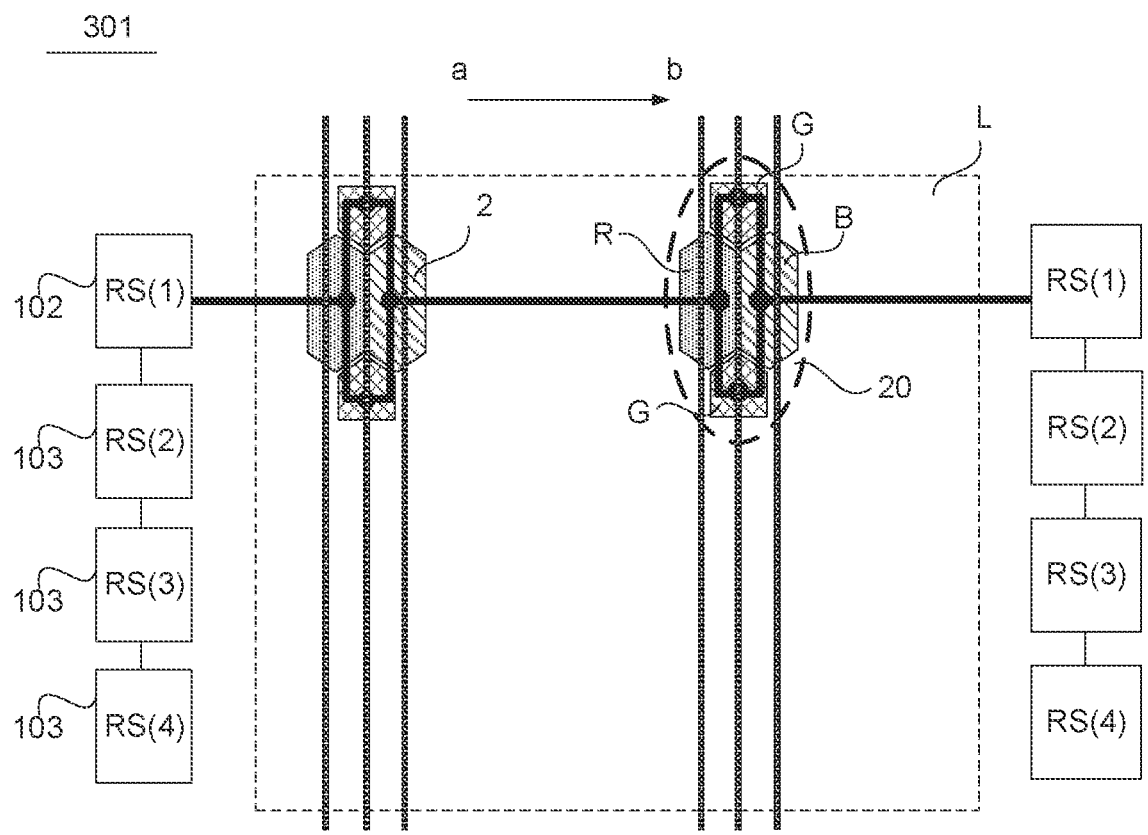
FIG. 6 is a structural diagram of another array substrate, in accordance with some embodiments.

In some embodiments, as shown in FIG. 6, the plurality of second sub-pixels 2 included in the second pixel unit 20 are coupled to a same second shift register circuit 102.

In this case, since the plurality of second sub-pixels 2 of the second pixel unit 20 in the second region H are driven only through the same second shift register circuit 102, the number of signal lines coupled with the second pixel unit 20 is reduced, which may reduce a light-shielding area of signal lines in the array substrate 301.

For example, in some embodiments, as shown in FIG. 6, in a case where the second pixel unit 20 includes one first color sub-pixel R, one second color sub-pixel B and two third color sub-pixels G, the two third color sub-pixels G are connected in parallel. The two third color sub-pixels G connected in parallel, the first color sub-pixel R and the second color sub-pixel B are connected in series to one second shift register circuit 102.

Figure 7:
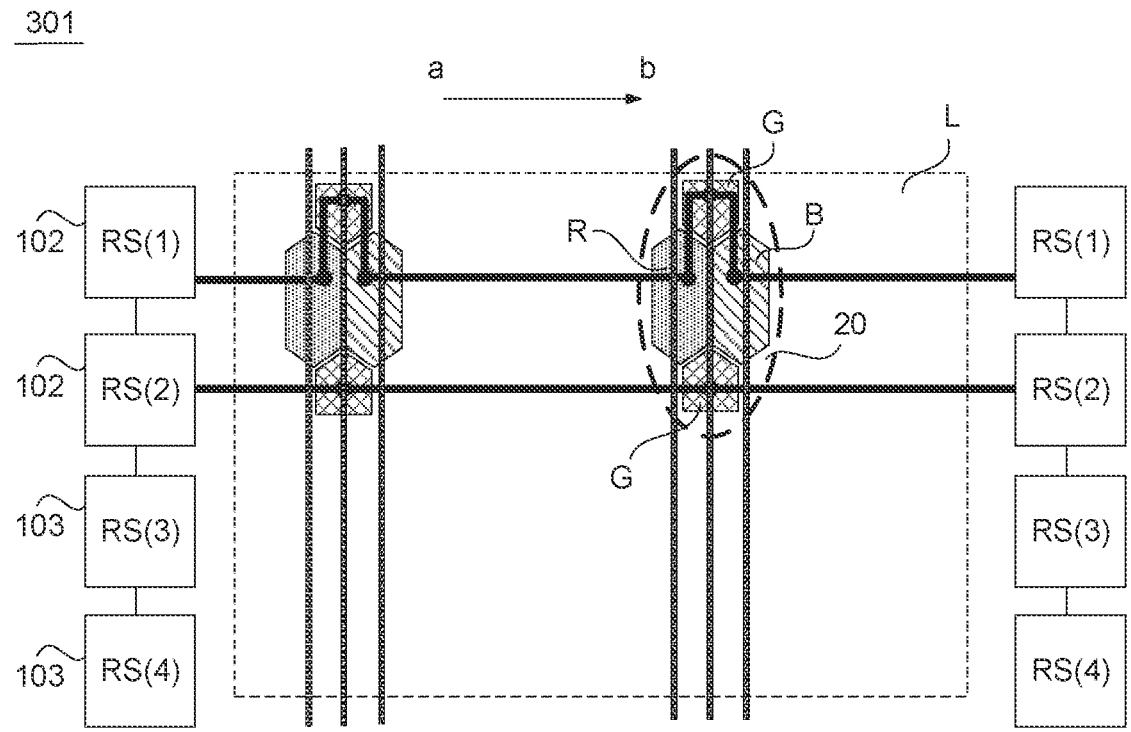
FIG. 7 is a structural diagram of yet another array substrate, in accordance with some embodiments.

In some embodiments, as shown in FIG. 7, the plurality of second sub-pixels 2 included in the second pixel unit 20 are coupled with at least two second shift register circuits 102.

In this case, the second sub-pixels 2 in the second region L of the pixel structure 200 may be driven by the second shift register circuit 102 in the driver circuit 301, so as to enable the second region L of the pixel structure 200 to realize the display function.

In some embodiments, as shown in FIG. 7, the second pixel unit 20 includes one first color sub-pixel R, one second color sub-pixel B and two third color sub-pixels G. One of the two third color sub-pixels G, the first color sub-pixel R and the second color sub-pixel B are connected in series to one second shift register circuit 102 (e.g., the first stage shift register circuit RS(1) in FIG. 7), and another one of the two third color sub-pixels G is coupled with another second shift register circuit 102 (e.g., the second stage shift register circuit RS(2) in FIG. 7).

It will be noted that, the shift register circuit RS includes a scan signal output circuit for outputting a gate scan signal and a light emission signal output circuit for outputting a light emission enable signal, so as to drive sub-pixels coupled with the shift register circuit RS.

In addition, the second shift register circuits 102 in the driver circuit 302 may drive the second pixel units 20 in a single-sided driving manner, that is, the second shift register circuits 102 are disposed on a single side of the array substrate 301 in the row direction ab, and the second pixel units 20 are driven from the same side. Or, the second shift register circuit 102 in the driver circuit 302 may drive the second pixel units 20 in a double-sided driving manner, that is, the second shift register circuits 102 may be disposed on two sides of the array substrate 301 in the row direction ab, and the second pixel units 20 may be simultaneously driven by two second shift register circuits 102 from the two sides.

In some embodiments, a same data signal may be transmitted to the two third color sub-pixels G in the second pixel unit 20 of the pixel structure 200 through a same date signal line, so that the two third color sub-pixels G may display a same gray scale value synchronously.

For example, the first pixel unit 10 and the first shift register circuit 101 may be coupled in a same way as the second pixel unit 20 and the second shift register circuit 102. For example, the plurality of first sub-pixels 1 included in a first pixel unit 10 are coupled to a same first shift register circuit 101, or the plurality of first sub-pixels 1 included in the first pixel unit 10 are coupled with at least two shift register circuits 102.

In some embodiments, as shown in FIG. 5, the plurality of shift register circuits RS further include a plurality of third shift register circuits 103. The plurality of third shift register circuits 103 are not coupled with the first pixel unit 10 or the second pixel unit 20.

As shown in FIGS. 5 to 7, the plurality of third shift register circuits 103 are located on at least one side of the second region L of the pixel structure 200.

An arrangement density of the plurality of first shift register circuits 101 is equal to an overall arrangement density of the at least one second shift register circuit 102 and the plurality of third shift register circuits 103.

That is, in the plurality of shift register circuits RS, the shift register circuits RS that are used as the first shift register circuits 101 have an arrangement density equal to an arrangement density of the shift register circuits RS that are used as the second shift register circuits 102 and the third shift register circuits 103.

It will be noted that, a signal output by the third shift register circuit 103 is a dummy signal for cascading a shift register circuit coupled with the third shift register circuit 103, and the dummy signal may be a cascade signal. The third shift register circuits 103 are used as placeholders to realize synchronous display of the first region H and the second region L.

It will be understood that, the third shift register circuits 103 are not coupled with gate lines.

For example, the second stage shift register circuit RS(2), the third stage shift register circuit RS(3) and the fourth stage shift register circuit RS(4) in FIG. 6 are all third shift register circuits 103, and signals output by them are all cascade signals. The third stage shift register circuit RS(3) and the fourth stage shift register circuit RS(4) in FIG. 7 are both third shift register circuits 103, and signals output by them are both cascade signals.

Figure 8:
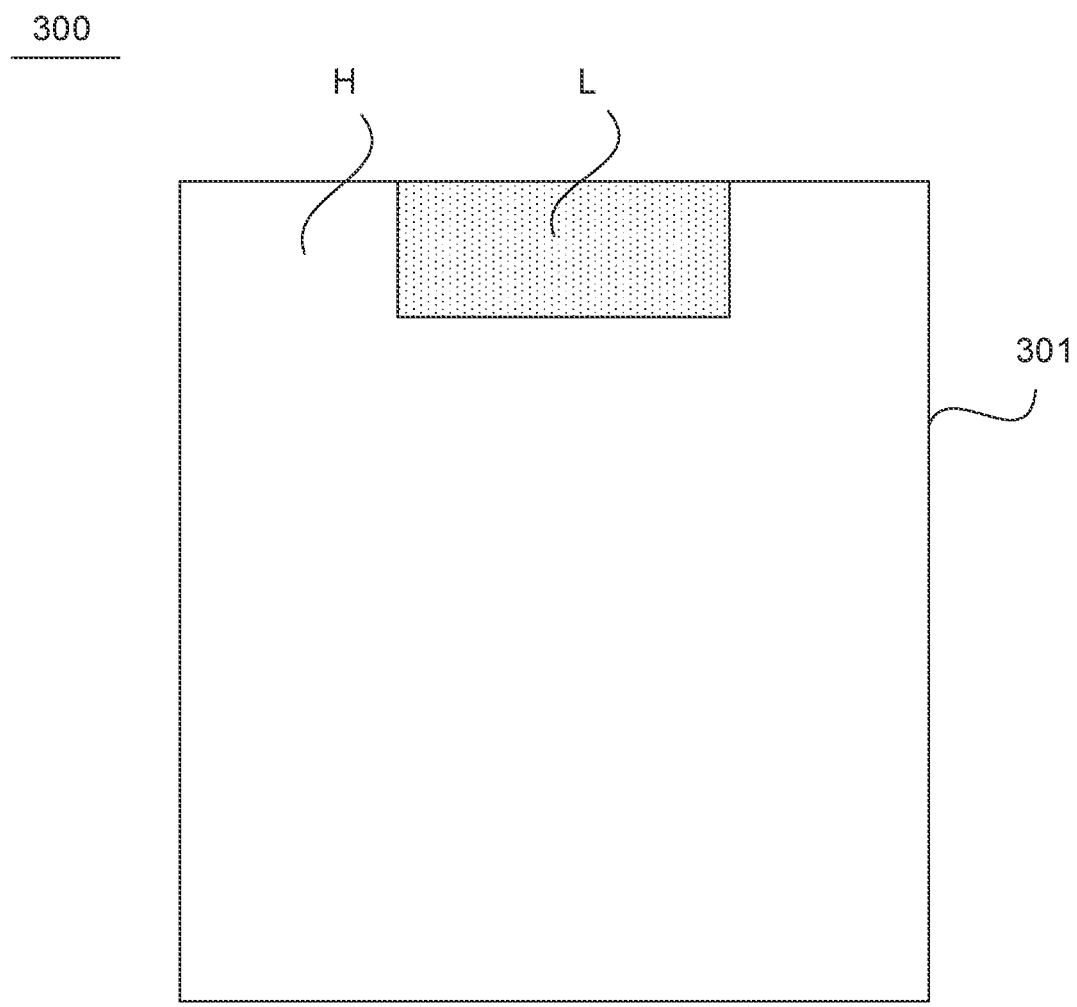
FIG. 8 is a structural diagram of a display apparatus, in accordance with some embodiments.

An embodiment of the present disclosure provides a display apparatus 300. As shown in FIG. 8, the display apparatus 300 includes the array substrate 301 provided by any of the above embodiments.

For example, an AMOLED (active-matrix organic light-emitting diode) may be applied to the display apparatus 300.

The display apparatus 300 may be any device that displays images whether in motion (e.g., a video) or stationary (e.g., a static image), and whether literal or graphical. More specifically, it is anticipated that the described embodiments may be implemented in or associated with a variety of electronic devices. The variety of electronic devices may include (but not limit to), for example, mobile telephones, wireless devices, portable android devices (PAD), hand-held or portable computers, global positioning system (GPS) receivers/navigators, cameras, MPEG-4 Part 14 (MP4) video players, video cameras, game consoles, watches, docks, calculators, TV monitors, flat-panel displays, computer monitors, car displays (such as an odometer display), navigators, cockpit controllers and/or displays, camera view displays (such as rear view camera display in a vehicle), electronic photos, electronic billboards or signages, projectors, building structures; and packaging and aesthetic structures (such as a display for an image of a piece of jewelry).

It will be noted that, the display apparatus 300 has the same beneficial effect as the pixel structure 200 in the array substrate 301 described above, and will not be described in detail herein again.

An embodiment of the present disclosure provides a control method of the pixel structure 200 as described in any of the above embodiments. Referring to FIG. 1, the first pixel unit 10 and the second pixel unit 20 in the pixel structure 200 both include one first color sub-pixel R, one second color sub-pixel B and two third color sub-pixels G.

Figure 9:
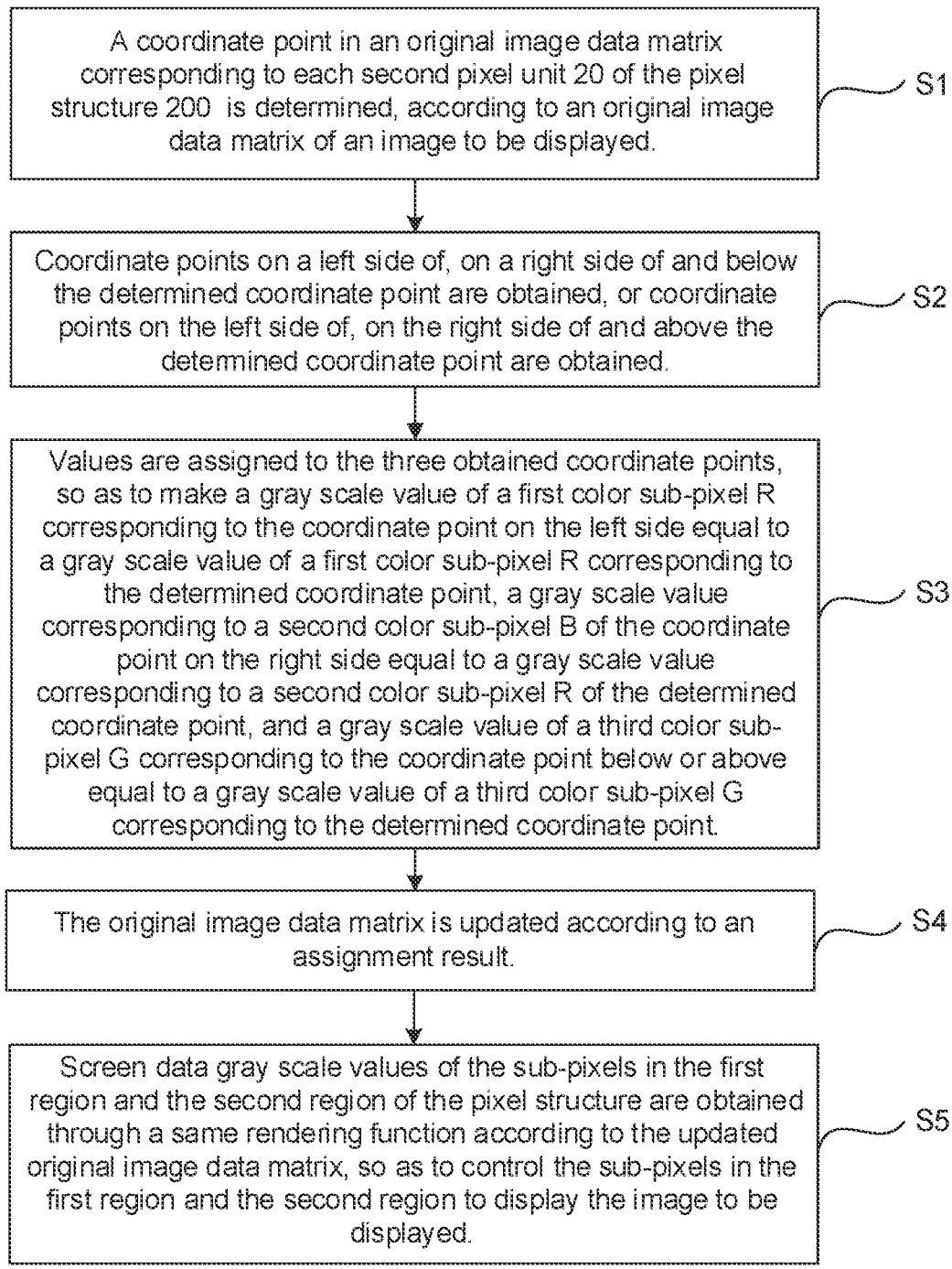
FIG. 9 is a flow diagram of a control method of a pixel structure, in accordance with some embodiments.

As shown in FIG. 9, the control method includes the following steps.

In S1, according to an original image data matrix of an image to be displayed, a coordinate point in the original image data matrix corresponding to each second pixel unit 20 of the pixel structure 200 is determined.

In S2, coordinate points on a left side of, on a right side of and below the determined coordinate point are obtained; or coordinate points on the left side of, on the right side of and above the determined coordinate point are found.

In S3, values are assigned to the three obtained coordinate points, so as to make a gray scale value of a first color sub-pixel R corresponding to the coordinate point on the left side equal to a gray scale value of a first color sub-pixel R corresponding to the determined coordinate point, a gray scale value of a second color sub-pixel B corresponding to the coordinate point on the right side equal to a gray scale value of a second color sub-pixel R corresponding to the determined coordinate point, and a gray scale value of a third color sub-pixel G corresponding to the coordinate point below or above equal to a gray scale value of a third color sub-pixel G corresponding to the determined coordinate point.

In S4, the original image data matrix is updated according to an assignment result.

In S5, screen data gray scale values of the sub-pixels in the first region and the second region of the pixel structure are obtained through a same rendering function according to the updated original image data matrix, so as to control the sub-pixels in the first region and the second region to display the image to be displayed.

For example, the third color is green; the first color is red and the second color is blue, or the first color is blue and the second color is red.

The "original image data matrix" is a matrix used to represent gray scale values of the image pixels in the image to be displayed. The "coordinate point" refers to a matrix element in the original image data matrix. For example, a coordinate point of an image pixel in the p-th row and q-th column of the image to be displayed is (p, q), then a gray scale value $y_1(p, q)$ of a first color sub-pixel, a gray scale value $y_2(p, q)$ of a second color sub-pixel, and a gray scale value $y_3(p, q)$ of third color sub-pixels in the pixel are all recorded in the original image data matrix.

It will be noted that, the image pixel is a different concept from a pixel in a display apparatus, which is a physical structure, yet the image pixel is a constituting unit of an image that can be actually observed by human eyes.

In addition, the second pixel unit 20 in S1 is a pixel located in the second region L of the pixel structure 200 in the array substrate 301 of the display apparatus 300. The second pixel unit 20 is used for displaying one image pixel in the image to be displayed, and one second pixel unit 20 corresponds to one coordinate point in the original image data matrix.

In the above control method, in the original image data matrix, by reassigning values to the coordinate points adjacent to the coordinate point corresponding to the second pixel unit 20 in the second region L, the screen data gray scale values of the sub-pixels in the second region L and the first region H are calculated through the same rendering function, which improves an overall coherence of the display effect of the display apparatus 300 and realizes the under-screen sensing function of the display apparatus 300.

For example, as shown in FIG. 4, the S5 of the control method above is further described by taking an example of controlling two adjacent first screen pixels in a same pixel row in the first region H, a first screen pixel (m, n) and a first screen pixel (m, n+1).

In the first region H, the first screen pixel (m, n) is composed of one first color sub-pixel R and one third color sub-pixel G, and the first screen pixel (m, n+1) is composed of one second color sub-pixel B and one third color sub-pixel G.

In S5, obtaining the screen data gray scale values of the sub-pixels in the first region H of the pixel structure through the same rendering function f includes:

obtaining screen data gray scale values of different colors of sub-pixels in the first screen pixel (m, n) and the first screen pixel (m, n+1) according to the following equations (1) to (4):

$$Y_1(m,n)=f[y_1(m,n+1),y_1(m,n)] \quad (1);$$

$$Y_3(m,n)=y_3(m,n) \quad (2);$$

$$Y_2(m,n+1)=f[y_2(m,n+1),y_2(m,n+2)] \quad (3);$$

$$Y_3(m,n+1)=y_3(m,n+1) \quad (4).$$

Herein, $Y_1(m, n)$ represents a screen data gray scale value of the first color sub-pixel R in the first screen pixel (m, n), and $Y_3(m, n)$ represents a screen data gray scale value of the third color sub-pixel G in the first screen pixel (m, n). $Y_2(m, n+1)$ represents a screen data gray scale value of the second color sub-pixel B in the first screen pixel (m, n+1), and $Y_3(m, n+1)$ represents a screen data gray scale value of the third color sub-pixel G in the first screen pixel (m, n+1).

In addition, function y represents the gray scale values of the original image data matrix, $y_1$ represents a gray scale value of a first color sub-pixel R in the original image data, $y_2$ represents a gray scale value of a second color sub-pixel B in the original image data, and $y_3$ represents a gray scale value of a third color sub-pixel G in the original image data.

For example, as shown in FIG. 1, the S5 in the above control method above is further described by taking an example of controlling the second screen pixel (i, j) in the second region L. It will be noted that, the second screen pixel (i, j) is a second pixel unit 20.

In S5, obtaining the screen data gray scale values of the sub-pixels in the second region L of the pixel structure through the same rendering function f includes:

calculating screen data gray scale values of different colors of sub-pixels in the second screen pixel (i, j) of the second region L according to the following equations (5) to (7):

$$Y_1(i,j)=f[y_1(i,j-1),y_1(i,j)] \quad (5),$$

$$Y_2(i,j)=f[y_2(i,j),y_2(i,j+1)] \quad (6);$$

$$Y_3(i,j)=Y_3'(i,j)=f[y_3(i,j),y_3(i+1,j)] \quad (7)$$

Herein, $Y_1(i, j)$ is a screen data gray scale value of the first color sub-pixel R, $Y_2(i, j)$ is a screen data gray scale value of the second color sub-pixel B, $Y_3(i, j)$ and $Y_3'(i, j)$ is screen data gray scale values of the two third color sub-pixels G.

In addition, function y represents the gray scale values of the original image data matrix, $y_1$ represents a gray scale value of a first color sub-pixel R in the original image data, $y_2$ represents a gray scale value of a second color sub-pixel B in the original image data, and $y_3$ represents a gray scale value of a third color sub-pixel G in the original image data.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A control method of a pixel structure, wherein the pixel structure has a first region and a second region; the pixel structure comprises a plurality of first pixel units disposed in the first region and at least one second pixel unit disposed in the second region; each first pixel unit and each second pixel unit in the pixel structure both include one first color sub-pixel, one second color sub-pixel and two third color sub-pixels; and the control method comprises:
determining a coordinate point in an original image data matrix corresponding to each second pixel unit of the pixel structure according to the original image data matrix of an image to be displayed;
obtaining coordinate points on a left side of, on a right side of and below the determined coordinate point, or coordinate points on the left side of, on the right side of and above the determined coordinate point;
assigning values to the three obtained coordinate points, so as to make a gray scale value of a first color sub-pixel corresponding to the coordinate point on the left side equal to a gray scale value of a first color sub-pixel corresponding to the determined coordinate point, a gray scale value of a second color sub-pixel corresponding to the coordinate point on the right side equal to a gray scale value of a second color sub-pixel corresponding to the determined coordinate point, and a gray scale value of a third color sub-pixel corresponding to the coordinate point below or above equal to a gray scale value of a third color sub-pixel corresponding to the determined coordinate point;
updating the original image data matrix according to an assignment result; and
obtaining screen data gray scale values of sub-pixels in the first region and the second region of the pixel structure through a same rendering function according to the updated original image data matrix, so as to control the sub-pixels in the first region and the second region to display the image to be displayed.

2. An array substrate, comprising:
a base;
a pixel structure disposed on the base, the pixel structure having a first region and a second region; the pixel structure comprising:
a plurality of first pixel units disposed in the first region;
at least one second pixel unit disposed in the second region; wherein
a distribution density of the plurality of first pixel units in the first region is greater than a distribution density of the at least one second pixel unit disposed in the second region;
each first pixel unit includes a plurality of first sub-pixels, and each second pixel unit includes a plurality of second sub-pixels; a number of the first sub-pixels included in the first pixel unit is equal to a number of the second sub-pixels included in the second pixel unit; and a number of at least one first sub-pixel of the first pixel unit that displays a color is equal to a number of at least one second sub-pixel of the second pixel unit that displays a same color, and light-emitting areas of a first sub-pixel and a second sub-pixel that display a same color are equal; and a driver circuit disposed on the base, the driver circuit including a plurality of cascaded shift register circuits that include a plurality of first shift register circuits and at least one second shift register circuit, wherein each first pixel unit in the pixel structure is coupled with at least one first shift register circuit, and each second pixel unit in the pixel structure is coupled with the at least one second shift register circuit;

the plurality of second sub-pixels included in the second pixel unit are coupled with a same second shift register circuit or at least two second shift register circuits.

3. The array substrate according to claim 2, wherein the plurality of first sub-pixels included in the first pixel unit include one first color sub-pixel, one second color sub-pixel and two third color sub-pixels; and the plurality of second sub-pixels included in the second pixel unit include one first color sub-pixel, one second color sub-pixel and two third color sub-pixels;

wherein the first color, the second color and the third color are three primary colors.

4. The array substrate according to claim 3, wherein in the first region, the first color sub-pixel, the second color sub-pixel, and the two third color sub-pixels are arranged periodically in a row direction of an arrangement of sub-pixels, and the two third color sub-pixels are arranged in a column direction of the arrangement of the sub-pixels; and first sub-pixels in every two adjacent rows are staggered from each other in the column direction.

5. The array substrate according to claim 4, wherein in the second pixel unit, the first color sub-pixel and the second color sub-pixel are arranged adjacently in the row direction, and the two third color sub-pixels are arranged in the column direction and are respectively located on two sides of the first color sub-pixel and the second color sub-pixel in the column direction.

6. The array substrate according to claim 4, wherein in the second pixel unit, the first color sub-pixel and the second color sub-pixel are arranged adjacently in the row direction, and the two third color sub-pixels are arranged in the column direction and are both located on one of two sides of the first color sub-pixel and the second color sub-pixel in the column direction.

7. The array substrate according to claim 4, wherein in the second pixel unit, the first color sub-pixel, the two third color sub-pixels and the second color sub-pixel are arranged sequentially in the row direction, and the two third color sub-pixels are arranged in the column direction.

8. The array substrate according to claim 3, wherein the at least one second pixel unit includes a plurality of second pixel units;

in a column direction in which sub-pixels are arranged, a column of red sub-pixels in the second region are aligned with a column of red sub-pixels in the first region;

a column of blue sub-pixels in the second region are aligned with a column of blue sub-pixels in the first region; and a column of green sub-pixels in the second region are aligned with a column of green sub-pixels in the first region.

9. The array substrate according to claim 3, wherein the first color is red and the second color is blue, or the first color is blue and the second color is red; and the third color is green.

10. The array substrate according to claim 3, wherein a light-emitting area of the first color sub-pixel is equal to a light-emitting area of the second color sub-pixel, and a light-emitting area of the third color sub-pixel is half of the light-emitting area of the first color sub-pixel.

11. A display apparatus, comprising the array substrate according to claim 2.

12. The array substrate according to claim 2, wherein the plurality of second sub-pixels include one first color sub-pixel, one second color sub-pixel and two third color sub-pixels; wherein in a case where the plurality of second sub-pixels included in the second pixel unit are coupled with a same second shift register circuit, the two third color sub-pixels are connected in parallel, and the two third color sub-pixels connected in parallel, the first color sub-pixel and the second color sub-pixel are connected in series to the second shift register circuit.

13. The array substrate according to claim 2, wherein the plurality of second sub-pixels include one first color sub-pixel, one second color sub-pixel and two third color sub-pixels; wherein in a case where the plurality of second sub-pixels included in the second pixel unit are coupled with at least two second shift register circuits, one of the two third color sub-pixels, the first color sub-pixel and the second color sub-pixel are connected in series to one second shift register circuit, and another one of the two third color sub-pixels is coupled with another second shift register circuit.

14. The array substrate according to claim 2, wherein the plurality of shift register circuits further include a plurality of third shift register circuits, and the plurality of third shift register circuits are not coupled with the first pixel unit or the second pixel unit;

the plurality of third shift register circuits are located on at least one side of the second region of the pixel structure; and an arrangement density of the plurality of first shift register circuits is equal to an overall arrangement density of the at least one second shift register circuit and the plurality of third shift register circuits.

* * * * *